United States Patent [19]

Roos et al.

[11] Patent Number: 4,872,212
[45] Date of Patent: Oct. 3, 1989

[54] MICROWAVE MAIN FRAME

[75] Inventors: Mark D. Roos, San Carlos; Walter J. Messmer, III, San Jose, both of Calif.

[73] Assignee: EIP Microwave, Inc., San Jose, Calif.

[21] Appl. No.: 50,820

[22] Filed: May 15, 1987

[51] Int. Cl.$^4$ .............................................. H05K 9/00
[52] U.S. Cl. .................................. 361/424; 174/35 R; 174/35 GC; 361/399; 361/413; 361/415
[58] Field of Search .......... 174/35 R, 35 MS, 35 GC; 361/394, 395, 399, 413, 415, 424

[56] References Cited

U.S. PATENT DOCUMENTS 4,384,368  5/1983  Rosenfeldt et al. ................. 361/424
4,642,735  2/1987  Hodsdon et al. .................... 361/394

FOREIGN PATENT DOCUMENTS 3228398  2/1984  Fed. Rep. of Germany .... 174/35 R
1324560  7/1973  United Kingdom ............. 174/35 R Primary Examiner—Gregory D. Thompson
Attorney, Agent, or Firm—Nilsson, Robbins, Dalgarn, Berliner, Carson & Wurst

[57] ABSTRACT

An electronic device which includes multiple components separately housed in electromagnetically isolating modular units, which units are interchangeably and detachably mounted in a frame. The frame and modular units are formed to releasably connect the various components to sources of electrical and/or microwave energy.

6 Claims, 3 Drawing Sheets

MICROWAVE MAIN FRAME

BACKGROUND OF THE INVENTION

The present invention relates to electronic devices, more specifically to modular electronic devices which include numerous interchangeable electronic components.

Electronic devices include, for example, microwave devices, e.g., microwave antenna and microwave network analysis testing devices. All electronic devices must be constructed to electromagnetically shield the individual components making up the device. This is particularly important if the device includes numerous components which would be affected by electromagnetic radiation, e.g., printed circuits and the like. These types of components must be isolated from extraneous electromagnetic radiation which would affect their operation. Furthermore, the components must be shielded to reduce the potential of electromagnetic energy emission to the external environment.

Presently, the electromagnetic shielding is performed by independently housing each component. This housing is formed from an electrically conductive material, e.g., aluminum. The individually housed components are then assembled, with any necessary interconnections between the numerous components being made using appropriate electromagnetic cables or wave guides. The device is thus an accumulation of numerous separate housings. This type of construction achieves the desired result, that is, electromagnetic isolation of the numerous device components; however, the resulting device configuration is cumbersome.

The individual device components may also include separate subunits, e.g., a daughter board of a printed circuit board, which needs to be separately electromagnetically isolated. However, presently available construction techniques make the separate electromagnetic isolation of these individual subunits impractical.

Another reason for separately housing the individual device components is to reduce the replacement cost of components which become inoperative. By separately housing the individual component, a particular inoperative component is easily replaced without interfering with the remaining components; however, the disadvantage of assembling these separately housed components remains.

It would thus be beneficial to provide a structure which houses numerous interchangeable modular electronic components, while maintaining the electromagnetic isolation between the individual components. Further, the structure should be formed to provide for the distribution of electronic power and data, and for microwave devices for the distribution of microwave energy, between the individual components.

SUMMARY OF THE INVENTION

The invention is directed to an electronic device main frame which includes multiple components separately housed in electromagnetically isolating modular units, which units are interchangeably and insertably mounted in a main frame. The main frame and modular units are formed to releasably connect the various components to sources of electrical and/or microwave signals.

Specifically, the invention is directed to a modular microwave component device. The individual microwave components are housed in separate electromagnetic shielding modular units. These units are formed to be slid into a main housing which is formed to receive multiple ones of the separately housed microwave components. This main housing is formed to further electromagnetically isolate the microwave components.

The main housing also includes a distribution backplane which is formed with multiple connectors to which the individual components can be mateably connected for selectively receiving electrical and microwave energy. The distribution backplane may also connect the components to a computer for providing communication between the individual components and the computer.

BRIEF DESCRIPTION OF THE DRAWINGS

The present invention may be better understood and its advantages will be apparent to those skilled in the art by reference to the accompanying drawings, wherein like reference numerals refer to like elements in the several Figures, and wherein.

DESCRIPTION OF THE INVENTION

The invention is directed to an electronic modular device which includes selectively arranging multiple modular units in a main frame, with each unit being separately electromagnetically isolated from the other component units in the main frame. The main frame and individual modular units are formed to allow the modular units to be interchangeably and removably inserted into the main frame along predefined tracks. The main frame also includes a distribution backplane which is formed to include multiple connectors to which connectors of each modular unit may be separately mated.

The distribution backplane connectors are selectively coupled to a source of electrical power, microwave energy or data signals, e.g., a computer. This distribution backplane is disposed in the main frame and formed to position the connectors at appropriate positions for alignment with each of the predefined tracks along which a modular unit will be inserted into the main frame. This disposes the backplane connectors for mating with the individual modular unit connectors.

While the present invention will be described in relation to those components of a microwave device, e.g., a microwave network analysis system, which includes various testing components, the modular unit of the invention may be used with any electronic device made up of multiple components which requires that the individual components be electromagnetically isolated.

Figure 1:
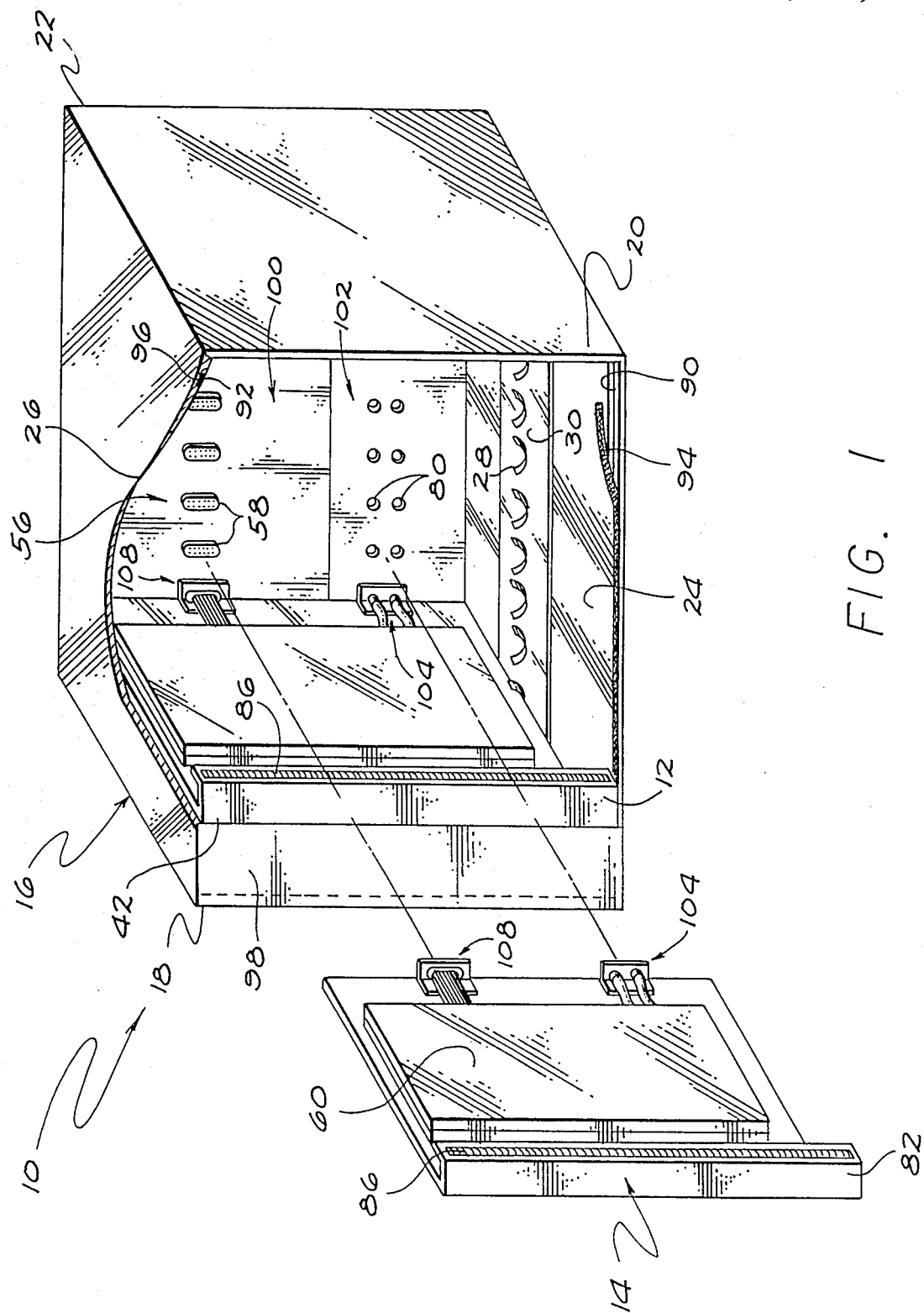
FIG. 1 is a partially cut-away view of a main frame in accordance with the invention in which multiple components are separately housed in modular units which are selectively insertable in a main frame housing.

Referring to FIG. 1, a modular microwave network analysis device is generally seen at 10. Generally, the microwave network analysis device 10 measures the microwave characteristic of a particular microwave component, e.g., switches, tunable microwave components, high gain amplifiers or multi-port devices. Particular ones of these types of components are assembled together to construct a specific microwave system, e.g. a microwave antenna. The various characteristics of microwave devices will affect the overall functioning of a system, e.g., an antenna in which the microwave components are incorporated. By knowing the characteristic of each particular microwave component, a systems engineer will be better able to calibrate the overall microwave characteristic for a given system, e.g., a microwave antenna.

The device 10 includes multiple modular units, two of which are illustrated at 12 and 14, in which are disposed microwave devices and appropriate other electrical components. Each of these modular units 12 and 14 may be interchangeably and removably inserted into a housing 16. The housing 16 is a generally box-like structure having two side walls 18 and 20, a back wall 22, a floor 24 and a ceiling 26. The front of the housing 16, which opposes the back wall 22 is at least partially open to receive the individual modular units, e.g., modular units 12 and 14. The modular units 12 and 14 include any type of component for performing a specific type of measurement on microwave energy. For example, one such component may measure the microwave energy frequency, while another component may measure any background noise introduced into the microwave energy signal.

The individual modular units 12 and 14 are formed to electrically isolate the microwave devices and electrical components from external sources of electromagnetic radiation and to prevent the emission of electromagnetic radiation from the modular unit. The individual modular units, e.g., modular units 12 and 14, are also formed to slide into the housing 16 along one of multiple tracks 28 which are formed along a guide member 30.

This guide member 30 is disposed along the housing floor 24, with a second similarly formed guide member, not shown, being disposed along the housing ceiling 26. The tracks of the upper disposed guide member, not shown, are aligned with the tracks 28 of the lower guide member 30. This defines a slot or track along which the individual modular units, e.g., modular units 12 and 14, can be slid for insertion in the housing 16. The configuration of the individual tracks 28 is compatible with the configuration of the individual modular units to allow for the sliding of the modular units into the housing 16.

Figure 2:
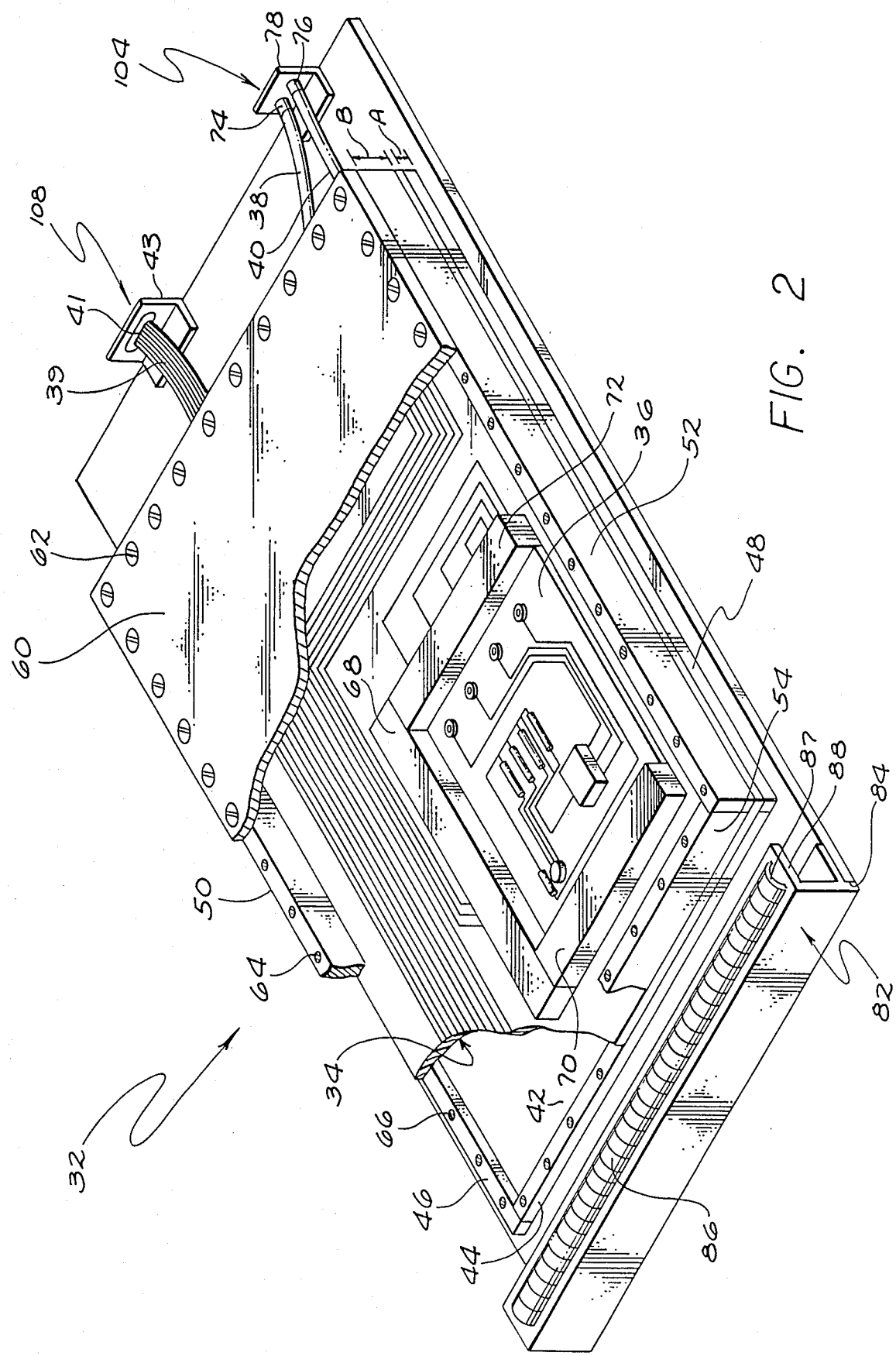
FIG. 2 is a partially broken-away view of an electromagnetically isolating modular unit housing for a component in accordance with an embodiment of the invention.

Referring now to FIG. 2, a partially broken-away view of a modular unit in accordance with the invention is seen generally at 32. This modular unit 32 houses any type of electronic component which for the purpose of this description is supported on a printed circuit board 34. The specific electronic component for which this circuit board 34 is to be used is not critical to the invention. The printed circuit board 34 includes a single subunit or daughter board 36. This daughter board 36 represents one portion of the overall printed circuit board 34. As will be described more fully herein, this daughter board 36 may also be electromagnetically isolated from the remainder of the printed circuit board 34 in accordance with a preferred embodiment of the invention.

Microwave energy is delivered to and from the printed circuit board 34 through a pair of microwave cables 38 and 40, with electric signals, including power and data signals, being delivered to and from the printed circuit board through a cable 39. The various subunits, e.g., daughter board 36, of the printed circuit board 34 are connected to the cables 38, 39 and 40 by known techniques, not illustrated, which are not critical to the invention.

These cables 38, 39 and 40 pass through a wall, not shown, of the modular unit 32. However, the modular unit 32 may be constructed to include one or more feed through type electronic connectors, e.g., a coaxial cable connector, supported through a wall for coupling with a suitable microwave or electronic cable, e.g., cables 38, 39 or 40. Connectors useful for this purpose are not critical to the invention and will not be described in any detail herein.

As stated, the modular unit 32 is formed to electromagnetically isolate the microwave devices and electronic components carried on the printed circuit board 34 from other devices and components housed in adjacent modular units of the device 10. This will insure that the only electronic energy which reaches the individual microwave devices and electronic components will be that energy passed through the respective cables of each modular unit. Since each of these cables, as well as suitable connectors, are themselves electromagnetically shielded, the danger of extraneous electromagnetic energy impairing the functioning of the individual devices and components is significantly reduced.

In accordance with a preferred embodiment of the invention each modular unit, e.g., modular unit 32, is formed by selectively assembling various electromagnetic isolating elements together. These elements are used to electromagnetically isolate, for example, the circuit board 34 and the devices and components carried by it.

Specifically, the modular unit 32 includes a platform 42 upon which the printed circuit board 34 is mounted. This platform 42, as well as the other elements of the modular unit is formed from an electrically conductive material, e.g., a conductive metal or a metal loaded plastic. The printed circuit board 34 is spatially separated from the platform 42 by one or more spacer elements, with three such spacer elements seen at 44, 46 and 48. A fourth spacer element, not shown, is positioned opposite the spacer element 44 between the platform 42 and the circuit board 34. As illustrated, the four spacer elements form a frame-like structure about the lower periphery of the circuit board 34.

Four additional spacer elements are secured about the periphery of the opposing side of the circuit board 34 to form a second frame-like structure. These four spacer elements, three of which are seen at 50, 52 and 54, enclose all of the structural subunits on the circuit board 34, e.g., daughter board 36.

All of the above described spacer elements are generally elongated rectangular members formed from an electrically conductive material. The length and thickness of the individual spacer elements will vary to allow for the appropriate selection of various spacer elements to form an enclosure about a circuit board and the specific devices and components thereon. However, the individual spacer elements may be constructed to be sufficiently thick enough to support a suitable pass through type connector. This, as stated, may be coupled to a coaxial cable allowing microwave energy to pass to the circuit board 34.

Suitable connector assemblies, seen generally at 104 and 108, are secured to the platform 42. The connectors 104 and 108 are mated to an appropriate aligned connector of a distribution panel backplane, which panel is seen generally in FIG. 1 at 56 with multiple connectors 58 and 80. As will be discussed, these connectors distribute electrical power and communication signals from a computer and microwave energy to the individual devices and components housed in the modular units forming a port of the present invention.

The spacer elements of the invention may enclose not only rectangular components, e.g., the circuit board 34, but may enclose a circular or odd shaped component. Further, by forming the individual spacer elements of varying thickness, the overall thickness of the modular unit 32 can be minimized. As illustrated, the spacer elements 50, 52 and 54 are thicker than the spacer elements, 44, 46 and 48, while the spacer elements 46, 48 and 52 are longer than the other spacer elements 44 and 54. The particular thickness and length of the individual spacer elements was selected to effectively enclose the printed circuit board 34.

The modular unit 32 is completed by securing a cover 60 atop the frame-like structure formed by the spacer elements 50, 52 and 54. The manner by which the entire modular unit 32 is fastened together will depend upon the materials form which the individual elements of the assembly, e.g., the spacer elements, platform 42 and cover 60, are constructed.

As illustrated, the various elements are constructed from a metallic material such as steel or aluminum; with the various elements fastened together by any suitable means, e.g. numerous threaded screws, one of which is seen at 62. In order to facilitate the fastening of the individual elements together, each such element is formed with one or more threaded apertures, one of which is seen formed in the element 50 at 64, and in the element 46 at 66. The top cover 60 and platform 42 are formed with countersunk holes, not shown, which can be aligned with the threaded apertures of the various elements. The various elements can then be positioned to line up the various apertures and the countersunk holes of the cover 60 and platform 42. A threaded screw is then threaded through each aligned group of apertures and holes to clamp the circuit board 34 between the elements. Other suitable fastening means include adhesives. The modular unit 32 may now be erected with other similar assemblies to construct the completed system.

The modular unit 32 as already described will provide sufficient electromagnetic shielding for the printed circuit board 34 and the devices and components thereon from other circuit boards in adjacent modular units. However, under certain conditions one or more of the subunits of the circuit board 34, e.g., daughter board 36, must also be electromagnetically isolated from the remainder of the circuit board 34.

The separate isolation of the individual daughter board 36 is particularly useful when the circuit board 34 is constructed utilizing one or more daughter boards. For example, the daughter board 36 may be constructed upon a separate substrate, as illustrated, and secured to the circuit board 34. In this manner, if the individual daughter board 36 becomes inoperative for any reason it may be replaced instead of replacing the entire circuit board 34. By further electromagnetically isolating the individual daughter boards from each other the potential of damage to such daughter boards by exposure to extraneous microwave energy is reduced.

In order to provide this separate isolation of the individual daughter board 36, the modular unit 32 further includes additional shielding elements which are positioned around the daughter board 36. Typically, four such elements are positioned along separate sides of the daughter board 36 to form a frame-like enclosure, with three of the four shielding elements indicated at 68, 70 and 72. These shielding elements, e.g., elements 68, 70 and 72 are formed to be selectively secured to the individual circuit board 34 about the daughter board 36. These shielding elements, in combination with the circuit board 34 and cover 60 fully enclose the daughter board 36.

While the individual shielding elements 68, 70 and 72 may be generally rectangular elements which are appropriately assembled for constructing a frame-like enclosure about a daughter board, the individual elements are preferably formed with one or more members which may be interlocked with compatibly formed members of the other shielding elements. That is, the shielding elements 68, 70 and 72 may be constructed with a mechanism which allows each element to interlock with another element. For example, the individual elements 68, 70 and 72 may be selectively formed with one or more tongues or grooves, which tongues are formed to be received in the grooves for locking the elements together. Another configuration is to form the individual elements with one ore more keys and/or keyways, with the keys being configured to be received in the keyways. However, the various shielding elements may be simply positioned side-by-side and secured in place without any interlocking mechanism. These shielding elements are utilized to construct where needed an appropriate electromagnetically isolated region. A particularly useful configuration for these shielding elements is disclosed in co-pending and commonly assigned U.S. patent application entitled MODULAR SHIELDING ASSEMBLY FOR ELECTRONIC DEVICES, Ser. No. 152,611 filed Feb. 5, 1988, now U.S. Pat. No. 4,800,464 listing as the inventors Mark D. Roos and Walter J. Messmer, III, which disclosure is incorporated herein by reference.

As stated, the microwave energy is delivered to the various microwave components in the modular units, e.g. unit 32, via co-axial cables 38 and 40. These cables 38 and 40 are secured to the connector assembly 104 which includes suitable cable connectors seen at 74 and 76, mounted to the ends of the cables 38 and 40, respectively. Further, the assembly 104 includes a mount 78 to which the connectors 74 and 76 are mounted. As will be described further herein, the mount 78, to which the connectors 74 and 76 are secured, is affixed to the platform 42 at a position and in a manner to promote the alignment and releasably mating of each connector 74 and 78 with a suitable microwave connector on the distribution backplane, as seen in FIG. 1 at 80 in the back panel 56. A cable 39 is secured to the assembly 108 which also includes a suitable connector 41, typically a multiple pin connector, which is affixed in a mount 43. This cable 39, which is usually a flat, multiple-wire cable, is used to supply electric power and signals to the various devices and components on the circuit board 34.

While the modular unit 32 described above and illustrated in FIGS. 1 and 2 includes only a single printed circuit board 34, the modular units of the invention may be constructed from one or more printed circuit boards. Each printed circuit board will be clamped between an arrangement of spacer elements such that the second and succeeding printed circuit boards function as covers to the adjacent printed circuit board, with the cover 60 mounted to the modular unit only after all of the circuit boards are in place.

Referring simultaneously to FIGS. 1 and 2, the individual modular units 32 will slide into the housing 16 along the slots defined by the aligned tracks 28. That is, the platforms 42 are dimensioned to be received in the individual tracks 28, with the aligned tracks 28 guiding the platform 42, and thus the modular unit 32, into the housing 16. The spatial separation between adjacent tracks 28 should be sufficient to allow the individual modular units 32 to placed side by side in the housing 16.

In order to provide a standard housing 16 into which various types of microwave components may be simultaneously housed, the individual modular units 32 should e constructed from substantially identically dimensioned components. That is, the individual shielding elements used to construct each of the modular units 32 should be substantially uniform to allow for the construction of the modular units 32. This is simplified by forming all of the lower spacer elements, e.g., elements 44, 46 and 48, with substantially equal heights (as indicated by the arrow A), with the upper spacer elements, e.g., elements 50, 52 and 54 also formed with substantially equal heights (as indicated by the arrow B). Furthermore, the cover 60 and platform 42 are of the same thickness, with each printed circuit board included in each modular unit also having the same thickness.

By dimensioning the various types of spacer elements with substantially equal heights, each modular unit 32 will possess a width as a function of the number of printed circuit boards included in that particular modular unit 32. In order to close off the opening of the housing 16 between adjacent modular units 32, each modular unit 32 includes a face plate 82. This face plate 82 will lie along the forwardmost side 84 of the platform 42, and be dimensioned to laterally extend outward from the platform 42 for a distance greater than the width of all of the assembled spacer elements and printed circuit boards. That is, the face plate 82 is wider than the remainder of the modular unit 32.

When the various modular units 32 are inserted into the housing 16 these face plates 82 will abut the platform 42 of the adjacent modular unit 32, such that when the housing 16 is filled with such modular units 32 a front wall, not indicated, is formed from the multiple face plates 82. This further electromagnetically isolates the individual devices and components housed within each of the modular units and prevents leakage of electromagnetic radiation from the completed system.

The device of the invention further includes various secondary elements for electromagnetically isolating the inside of the device main frame from the external environment. These secondary elements prohibit radiation, particularly microwave radiation, from leaking out of the device mainframe and effecting other equipment in the general vicinity. Further, these secondary electromagnetic isolating elements prevent radiation from the surrounding environment from entering the mainframe and effecting the device components.

A first of these secondary electromagnetically isolating elements is included on each of the modular units 32. Specifically, each of modular unit face plates 82 include a resilient electrically conductive strip 86 which is disposed to snugly fit between the face plate 82 and the adjacent modular unit 32 platform 42. This strip 86 is affixed along the length of a leg 88, which extends out at substantially a right angle from the remainder of the face plate 82. Thus, when the modular units 32 are inserted side-by-side in the housing 32 these strips 86 will resiliently bear up against the adjacent platform 42. The strips 86 thus form an electromagnetic radiation seal between the individual modular units 32.

The illustrated resilient electrically conductive strips 86 are formed from multiple arched contact strips, one of which is seen at 87. These contact strips 87 are comprised of a resilient metal, i.e., a high-performance beryllium copper, and are connected along one end. When this conductive strip 86 is compressed between two solid objects, i.e., leg 88 and platform 42, the arched contact strips will be resiliently depressed; however, when the compression force is removed these contact strips will regain an arched configuration due to the metallic memory. A more detailed description of a particularly useful type of strip 86 can be found in U.S. Pat. No. 3,504,095, which disclosure is incorporated herein by reference. The conductive strips 86 may also be formed from any other suitable material, e.g., an elastomeric strip wrapped in a conductive foil.

Two additional secondary electromagnetically isolating elements are positioned along the top and bottom of the multiple modular units 32 disposed in the housing 16. Grooves 90 and 92 in both the floor 24 and ceiling 26, respectively are formed in close proximity to the open side of the housing 16. A resilient gasket 94 and 96 is laid in each of the respective grooves 90 and 92. Each of these gaskets is formed to be both resilient and electrically conductive. For example, an elongated elastomeric tubing, e.g., a length of silicone rubber tube, can be wrapped with an electrically conductive foil and inserted into the respective grooves 90 and 92. The gaskets 94 and 96 should be dimensioned to extend up out of the respective groove 90 and 92 to bear up against the face plate 82 and/or the platform 42 of each modular unit 32 inserted into the housing 16.

Thus, the combination of the construction of each modular unit 32, with the various strips 86 and gaskets 94 and 96, provide an effective elecromagnetic seal around all of the modular units in the housing 16. Further, the individual modular units 32 may be individually removed from the housing 16 without disturbing this electromagnetic seal, with the gaskets 86 and seals 94 and 96 formed to allow for the repetitive removal and reinsertion of numerous modular units 32 without losing the ability to provide the electromagnetic seal.

Referring to FIG. 1, the device 10 will also include a computer, illustrated generally at 98, which will be able to perform various tasks on the data being developed by the various components of the device 10. While the computer 98 is illustrated as positioned along side the various component modular units inside the main frame, the computer may, for example, be positioned along the rear of the device. That is, the computer 98 may be positioned along the back plane 56, either piggy backing the backplane 56 or outside the main frame along the rear wall 22. This computer is electrically coupled to each component via each of the multiple pin connectors 58.

The computer 98 may perform any desired function. For example, the computer may calculate the overall characteristics of the microwave energy measured prior to introducing a particular device, e.g., an amplifier, being tested into the microwave line, e.g., a microwave coaxial cable. The computer 98 can then compare, for example, the frequency and noise measurements present in the microwave energy, both before and after the inclusion of the device in the line, to determine the effect of the particular device on the microwave energy. A microwave network analysis system of the type being described is generally well known in the art and is not critical to the invention.

As stated, the device 10 includes a back panel 56 which further includes multiple connectors. Each of the modular units 32 includes one or more of each of the connector assemblies 104 and 108 which may be coupled to a selected one of the back panel 56 connectors. The type of connectors included in the back panel 56 are those through which electrical power and data signals may be transmitted, indicated generally at 58, and those through which microwave energy may be transmitted, indicated generally at 80.

The back panel 56 is shown divided into first and second regions, with the first region, indicated at 100, being the rear wall 22 of the device housing 16 and the second region being a microwave distribution bar 102. Multiple electrical connectors 58 are arranged in one or more rows, with only a single row seen in FIG. 1, and mounted in the first region 100. Multiple microwave connectors 80 are arranged in one or more rows, with two such rows seen in FIG. 1, and mounted in the distribution bar 102. The two rows of microwave connectors 80 are situated to position each microwave connector 80 in the first row vertically above one of the microwave connectors 80 of the second row.

Furthermore, each of the electrical connectors 58 is positioned above one pair of the microwave connectors 80. This arranges multiple vertically oriented pairs of the connectors 80 and a single electrical connector 58 for alignment and coupling with suitably disposed microwave and electrical connectors, e.g., microwave connector pairs 104 and electrical connectors 108 of the modular units 12 and 14, respectively, which modular unit is inserted into the housing 16.

Figure 3:
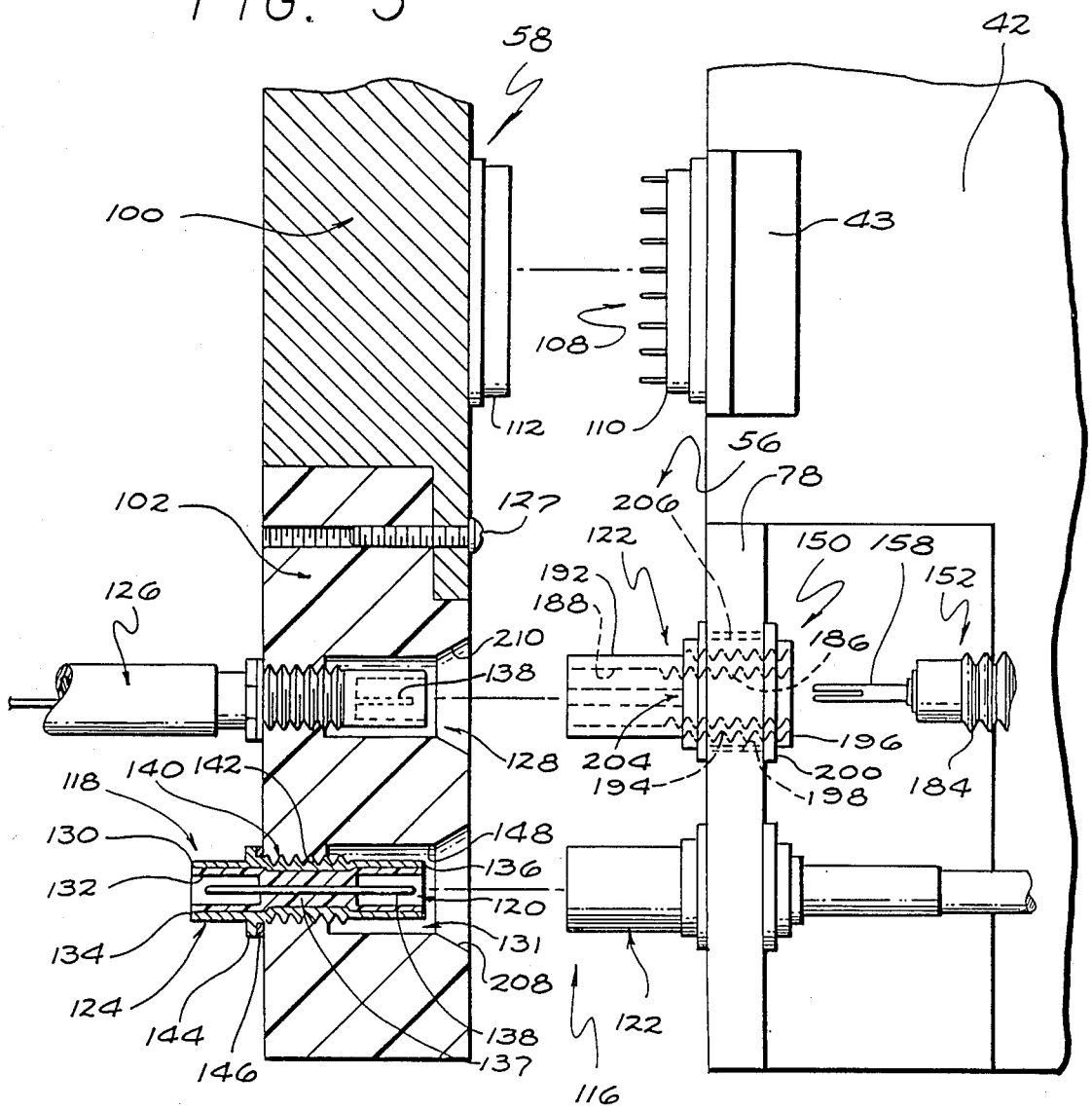
FIG. 3 is a partially broken-away and cross sectional view of a back plane through which electric power and signals, and microwave energy, are delivered to the individual modular units.

The electrical connectors 58 included in the distribution panel 56 and on the modular units 32 may be of any suitable type which provides multiple independent connections. For example, as seen in FIG. 3 these electrical connectors 58 and 108 may be a multiple pin type connector, with the respective male portion 108 mounted to the platform 42 of a modular unit 32 and the female portion 58 mounted to the back panel 56. The male portion 108 is mounted to the platform 42 using the L-shaped bracket mount 43.

The microwave connectors 80 may be those of the coaxial cable connector type or those of the microwave guide type, depending upon the type of microwave conduit used to direct the microwave energy to the individual components housed by the modular units 32.

A particularly preferred type of coaxial cable connector assembly, including the distribution bar 102 and modular units mount portions is seen in FIG. 3 generally at 116. The microwave distribution bar 102 is shown mounted to the rear device wall 22 by various screws, one of which is seen at 127. As will be discussed in greater detail below, the connector assembly 116 includes a distribution bar connector, here seen generally at 118. This connector 118 includes a first end 120 to which a modular unit mounted connector 122 may be coupled and a second end 124 which extends out from the rear of the device housing.

This arrangement positions each external end 124 of each distribution bar connector 118 for coupling to a coaxial cable connector, as indicated generally at 126. This coaxial cable connector 126 may be mounted to the end of a cable which is also connected to a source of microwave energy or to a cable which is connected at its other end to a external end 124 of a second distribution bar connector 118. This second distribution bar connector 118 may be coupled at its other end 120 to the same or different modular unit 32. Thus two distribution bar connectors 118 may be linked via a coaxial cable to distribute microwave energy either within the same modular unit 32 or between two different modular units 32.

Each distribution bar connector 118 of the distribution bar 102 is mounted in an aperture, two of which are seen at 131 and 128. Each of the distribution bar connectors 118 is a generally tubular shaped body formed with an outer electrically conductive tubing 130 which surrounds a cylindrical shaped insulating layer 132. While this insulating layer 132 will run the substantial length of the conductive tubing 130, its thickness will vary, with a thicker portion of the layer 132 laying midway between the opposing ends 134 and 136 of the tubing 130, as seen generally at 137.

An elongated filamentous conductor 138 is concentrically positioned in the tubular shaped insulating layer 132 and held in place by being embedded in the insulating layer thicker portion 137. While not running the entire length of the outer conductive tubing 130, the filament 138 will extend out of the opposing sides of the insulating layer thicker portion 137 to allow engagement by a connector affixed to an appropriate coaxial cable, as will be described in greater detail herein.

Each distribution bar connector 118 is mounted in the distribution bar 102 by any appropriate means. For example, the conductive tubing 130 may be formed to define an outer threaded portion, generally seen at 140, midway between the tubing 130 opposing ends 134 and 136. This threaded portion 140 engages and grips a threaded portion, seen generally at 142, of the aperture 131 by rotating the connector 118. This rotation is facilitated using a hexagonal shaped collar 144 integrally formed and extending radially out from the tubing 130. A washer 146 may be fitted between the collar 144 and the outer surface of the bar 102.

By providing that the length of the connector 118, in particular the tubing 130, is greater than the girth of the bar 102, the connector end 124 can be extended out from the bar 102. Furthermore, in accordance with a preferred embodiment of the invention, a portion of each of the apertures 131 and 128 will be formed wider in diameter than the remainder of the aperture 131 or 128 and wider in diameter than the respective connector 118 affixed therein, to form an annular shaped cavity about a respective portion of the connector 118, as indicated generally at 148 for aperture 131. As will be described, a portion of the modular unit mounted connector 122 will be received in this annular shaped cavity 148 and fits snugly about the outer conductive tubing 130.

The modular mounted connectors, seen generally at 122 and 122', are each fastened to the free end of a coaxial cable and may be used alone or affixed to a support, e.g., the mount 78. Each connector 122 and 122' includes a wall mounted portion 150 and a cable mounted portion 152. The wall mounted portion 150 is secured in the mount 78, with the cable mounted portion 152 secured therein. As will be described in greater detail herein, the wall mounted portion 150 is loosely affixed in the mount 78 to allow for an easy fit into the annular shaped cavity 128 or 131 of the bar 102.

Figure 4:
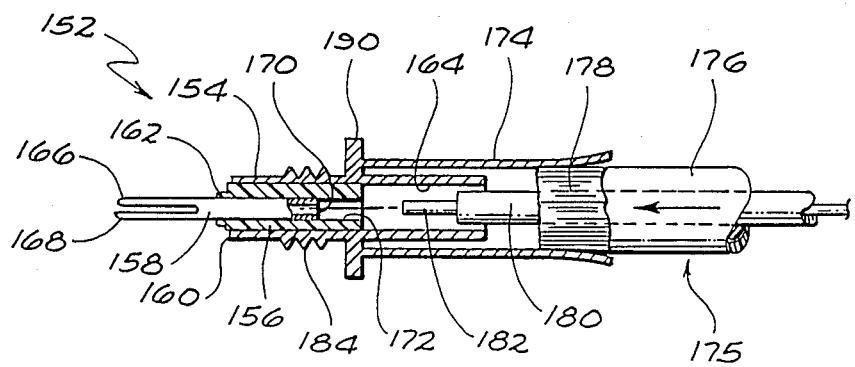

Referring to FIG. 4 the cable mounted portion 152 will be described. The cable mounted portion 152 is constructed from an outer conductive tubing 154 which surrounds a cylindrically shaped insulating layer 156, which itself surrounds an inner conductive core 158. These three portions of the cable mounted portion 152 are generally concentrically mounted.

The outer tubing 154 is an elongated tube structure in which the insulating layer 156 is positioned. The insulating layer 156 is shorter than the tubing 154 but extends out from a first tubing end 160. That portion of the insulating layer 156 which extends out from the tubing 154 is formed with a lesser diameter first end 162, to form a step-like portion. The other end of the tubing 154 in which the layer 156 is not positioned defines a passageway 164. As will be described below, a portion of a coaxial cable will be fitted into this passageway 164.

The inner conductive core 158 extends out from an insulating layer first end 162. This end of the core 158 is formed with two opposing prongs 166 and 168. These prongs 166 and 168 are formed to fit snugly about a stem connector filament 138 of a selected distribution bar connector 118. The opposing end of the core 158, indicated at 170, is tubular and dimensioned to snugly receive an inner coaxial cable conductive core. This tubular end 170 is recessed in the insulation layer 156, with a passageway 172 formed in the layer 156 to receive and direct an inner coaxial cable conductive core to the tubular end 170.

The cable mounted portion 152 is also formed with a crimp cylinder 174 positioned about the outer tubing 154. The crimp cylinder 174 lies along that portion of the tubing 154 opposite the tubing first end 160. This positions the crimp cylinder 174 about that portion of the tubing 154 in which is placed a portion of a coaxial cable. As will be discussed, the coaxial cable outer conductive layer may be placed between the outer tubing 154 and the crimp cylinder 174.

This cable mounted portion 152 is mounted to the end of a coaxial cable 175 by stripping back an a outer insulating sheathing 176 to expose a outer conductive layer 178, from which an insulation layer 180 extends and from which extends an inner conductor 182. The short length of the inner conductor 182 is dimensioned to fit through the connector insulation layer passage 172 and into the inner conductor tube end 170 when the coaxial cable insulation layer 180 is inserted into the connector outer conductive tubing passageway 164. The coaxial cable insulation 180 will abut the connector insulation layer 156. The outer conductive layer 178 is forced between the connector outer conductive tubing 174 and the crimp cylinder 174. The crimp cylinder 174 is then crimped down upon the outer cable conductor 178 to hold the cable mounted connector 152 in place.

In this manner, the cable mounted portion 152 and coaxial cable 175 form a continuous microwave transmitting structure. The cable outer conductor 178 abuts the connector outer conductive tubing 174 to form a continuous outer conductor, with the core 158 abutting the coaxial cable inner conductor 182 forming an inner conductor. A continuous insulative membrane is formed with the insulative layer 156 abutting the coaxial cable insulation 180. This insures integrity between the cable mounted portion 152 and the coaxial cable 175, which insures the integrity of the passage of the microwave energy through the coaxial cable and the connector assembly 116 of the invention.

Referring now to FIGS. 3 and 4, the cable mounted portion 152 may be fitted into, the wall mounted portion 150. Typically the cable mounted portion 152 includes threads 184 which are formed along the surface of the outer tubing 154. These threads 184 are received in a compatibly threaded portion 186 of a passageway 188 defined through the wall mounted portion 150. This allows for the mounting of the cable mounted portion 152 in the wall mounted portion 150. The cable mounted portion 152 is also formed with a hexagonal shaped collar 190 positioned contiguous to the threads 184 to facilitate the threading of the cable mounted portion 152 into the wall mounted portion 150.

The wall mounted portion 150 includes a conductive tube 192 that is formed with an outer threaded portion, seen generally at 194, and an outward extending flange 196. The threaded portion 194 is loosely positioned in an aperture, seen in phantom at 198, formed through the mount 78. This aperture 198 is slightly wider than the diameter of the tube 192 forming the wall mounted portion 150 in order to provide a loose fit therein.

The wall mounted portion 150 is affixed in this aperture 198 by placing the flange 196 in abutment with the wall of the mount 78. As illustrated, a washer 200 is placed between the flange 196 and the mount 78 wall with the flange 196 abutting the washer 200. A nut and washer assembly, seen generally at 204, is threaded along the threaded portion 194 toward and against the opposing wall of the mount 78 to affix the wall mounted portion 150 in place.

A tubular spacer 206 is loosely fitted about the threaded portion 194 of the wall mounted portion 150. This spacer 206 is dimensioned for loose fit in the aperture 198 and to be held between the opposing nut and washer assembly 204 and the washer 200. This ensures that the wall mounted portion 150 is loosely held in the aperture 198 of the mount 78, thus allowing for a slight lateral movement of the wall mounted portion 150 in both the vertical and horizontal direction. The usefulness of this manner of securing the wall mounted portion 150 in the wall aperture 198 will be discussed below.

The mating of the two components of the coupling connector assembly 116 is performed by sliding the wall mounted portion 150 over the conductive tubing 130 of the distribution bar connector 118. The inner diameter of the tubing of the wall mounted portion 150 and the outer diameter of the conductive tubing 130 should be provided to ensure a snug fit between the two. However, the outer diameter of the wall mounted portion 150 should be such to allow it to fit in the annular shaped cavity formed between the tubing 130 and the wall defining the aperture 128.

Further, the inner core 158 of the cable mounted portion 152 should be sized to fit snugly about the inner conductor 138 of the distribution bar connector 118.

By mating another cable mounted component, which may be of a similar construction or of any suitable construction to the opposite end of the distribution bar connector 118, a continuous microwave conduit is formed between two microwave coaxial cables, thus insuring the proper transmission of microwave energy from one coaxial cable to another.

In accordance with a more preferred embodiment, the connector assembly 116 described above is formed to promote the mating between the wall mounted portion 150 and the end 120 of the distribution bar connector 118. In this embodiment each aperture of the distribution bar 102, e.g., aperture 128 and 131, are formed to direct the tube 192 therein and engage the respective end of the distribution bar connector 118.

Each of the apertures, i.e., 128 or 131, are formed with a camming surface upon which the tube 192 will bear and be directed into the respective aperture. These camming surfaces, seen generally at 208 and 210, are defined about the outer end of each aperture 131 and 128 respectively. These camming surfaces 208 and 210 are angled to direct the wall mounted portion 150 into the respective aperture 131 or 128, and into a mating alignment with the end 120 of the distribution bar connector 118. These camming surfaces 208 and 210 are preferentially inwardly converging conically shaped surfaces.

In accordance with another preferred embodiment of the invention, the distribution bar 102 is formed to allow a user of the device 10 to identify which of the various modular units 32 is connected to a particular distribution bar connector 118. The user can then properly select which of the particular modular units 32 at access via the individual distribution bar connectors 118.

One manner to allow this identification is to form the distribution bar 102 with indicia at a location contiguous to one of the individual distribution bar connectors 118. The user can identify the modular unit 32 by knowing which indicia pertains to which of the modular units 32.

Another manner by which the individual modular units 32 may be identified is to form the distribution bar 102 from a transparent material, i.e., polycarbonate. By properly marking that surface of each of the modular units 32 located adjacent to the distribution bar 102, the user can visually observe the identity of each particular modular unit 32.

A particularly useful configuration for the distribution bar 102, as well as the connector assembly 116, is disclosed in co-pending and commonly assigned U.S. patent application Ser. No. 036,614 filed Apr. 10, 1987 entitled MICROWAVE DISTRIBUTION BAR, listing as the inventors D. Roos and Walter J. Messmer, III, which disclosure is incorporated herein by reference.

While the preferred embodiment has been described and illustrated, various substitutions and modifications may be made thereto without departing from the scope of the invention. Accordingly, it is to be understood that the present invention has been described by way of illustration and not limitation.

What is claimed is:
1. A mainframe for a microwave measurement system comprising:
    (a) a housing constructed of electromagnetic radiation shielding material, said housing including an open front and a distribution back plane;
    (b) a plurality of first electrical connectors supported on said distribution back plane;
    (c) a plurality of modular units removably received within said open front of said housing, each said modular unit including;
        1. at least a second electrical connector (104/108) for mating with one of said first electrical connectors on said distribution back plane,
        2. an enclosure (42/60/44/46/48/50/52/54) constructed of electromagnetic radiation shielding material, and
        3. a face plate (82), of all said modular units said face plates, when said modular units are received within said housing, forming a front for said mainframe; and
    (d) electrically conductive means (86/94/96) in electrical contact with said modular units when said modular units are received within said housing for sealing said front of said housing as to electromagnetic radiation.

2. A mainframe as defined in claim 1 wherein said electrically conductive means includes a first electrically conductive member (94/96) carried by said housing.

3. A mainframe as defined in claim 2 wherein said electrically conductive means (86) includes a second electrically conductive member carried by each said modular unit for electrically contacting an adjacent modular unit.

4. A mainframe as defined in claim 3 wherein said first and second electrically conductive means are resiliently deformable.

5. A mainframe as defined in claim 4 wherein at least one of said modular units includes a component therein capable of radiating microwave energy, separate electromagnetic radiation isolating means surrounding said component.

6. A mainframe as defined in claim 5 wherein said isolating means includes a plurality of electrically conductive metallic members surrounding said component.

* * * * *